United States Patent
Li et al.

(10) Patent No.: US 11,244,869 B2
(45) Date of Patent: Feb. 8, 2022

(54) FABRICATION OF LOGIC DEVICES AND POWER DEVICES ON THE SAME SUBSTRATE

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Liying Jiang, Albany, NY (US); John G. Gaudiello, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 161 days.

(21) Appl. No.: 16/860,919

(22) Filed: Apr. 28, 2020

(65) Prior Publication Data
US 2020/0258790 A1 Aug. 13, 2020

Related U.S. Application Data

(62) Division of application No. 15/843,786, filed on Dec. 15, 2017, now Pat. No. 10,685,886.

(51) Int. Cl.
*H01L 21/8234* (2006.01)
*H01L 21/8238* (2006.01)
(Continued)

(52) U.S. Cl.
CPC ........... *H01L 21/823487* (2013.01); *H01L 21/823828* (2013.01); *H01L 21/823857* (2013.01);
(Continued)

(58) Field of Classification Search
CPC ......... H01L 21/823487; H01L 27/2454; H01L 29/66666; H01L 29/78642; H01L 29/7827;
(Continued)

(56) References Cited

U.S. PATENT DOCUMENTS 5,637,898 A 6/1997 Baliga
6,218,224 B1 4/2001 Lukanc et al.
(Continued)

FOREIGN PATENT DOCUMENTS

| CN | 101452892 A | 6/2009 |
| CN | 103367141 A | 10/2013 |
| CN | 107316837 A | 11/2017 |

OTHER PUBLICATIONS

International Search Report and Written Opinion dated Mar. 27, 2019 for International Application No. PCT/IB2018/059558, 9 pages.

(Continued)

*Primary Examiner* — John A Bodnar
(74) *Attorney, Agent, or Firm* — Tutunjian & Bitetto, P.C.; Randall Bluestone

(57) ABSTRACT

A method of forming a logic device and a power device on a substrate is provided. The method includes forming a first vertical fin on a first region of the substrate and a second vertical fin on a second region of the substrate, wherein an isolation region separates the first region from the second region, forming a dielectric under-layer segment on the second vertical fin on the second region, and forming a first gate structure on the dielectric under-layer segment and second vertical fin on the second region.

20 Claims, 10 Drawing Sheets

(51) Int. Cl.
 *H01L 29/78* (2006.01)
 *H01L 29/06* (2006.01)
 *H01L 27/092* (2006.01)

(52) U.S. Cl.
 CPC .... *H01L 21/823885* (2013.01); *H01L 27/092* (2013.01); *H01L 29/0649* (2013.01); *H01L 29/7827* (2013.01)

(58) Field of Classification Search
 CPC ......... H01L 29/7828; H01L 21/823885; H01L 29/0676; H01L 27/18
 See application file for complete search history.

(56) References Cited

U.S. PATENT DOCUMENTS

| | | |
|---|---|---|
| 8,823,096 B2 | 9/2014 | Su et al. |
| 9,368,572 B1 | 6/2016 | Cheng et al. |
| 9,368,587 B2 | 6/2016 | Kocon et al. |
| 9,590,096 B2 | 3/2017 | Naik et al. |
| 9,741,716 B1 | 8/2017 | Cheng et al. |
| 9,741,842 B2 | 8/2017 | Pala et al. |
| 2010/0148224 A1 | 6/2010 | Zhao |
| 2013/0134512 A1 | 5/2013 | Cheng et al. |
| 2017/0243745 A1 | 8/2017 | Yilmaz |

OTHER PUBLICATIONS

Plumton et al., "A Low On-Resistance, High-Current GaAs Power VFET," IEEE Electron Device Letters. vol. 16. No. 4. Apr. 1995. pp. 142-144.
List of IBM Patents or Patent Applications Treated as Related dated Apr. 28, 2020, 2 pages.

FABRICATION OF LOGIC DEVICES AND POWER DEVICES ON THE SAME SUBSTRATE

BACKGROUND

Technical Field

The present invention generally relates to forming a logic transistor and a power transistor on the same substrate, and more particularly to fabricating a logic transistor and a power transistor from the same set of vertical fins formed on the same region of a substrate.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a logic device and a power device on a substrate is provided. The method includes forming a first vertical fin on a first region of the substrate and a second vertical fin on a second region of the substrate, wherein an isolation region separates the first region from the second region. The method further includes forming a dielectric under-layer segment on the second vertical fin on the second region. The method further includes forming a first gate structure on the dielectric under-layer segment and second vertical fin on the second region.

In accordance with another embodiment of the present invention, a method of forming a logic device and a power device on a substrate is provided. The method includes forming a first vertical fin on a first region of the substrate and a second vertical fin on a second region of the substrate, wherein an isolation region separates the first region from the second region. The method further includes forming a dielectric under-layer on the first vertical fin and the second vertical fin. The method further includes forming a masking block on the dielectric under-layer and second vertical fin on the second region that leaves a portion of the dielectric under-layer on the first vertical fin exposed. The method further includes removing the exposed portion of the dielectric under-layer to form a dielectric under-layer segment on the second vertical fin. The method further includes removing the masking block, and forming a gate dielectric layer on the dielectric under-layer segment and first vertical fin on the first region.

In accordance with yet another embodiment of the present invention, a logic device and a power device on a substrate is provided. The devices include a first vertical fin on a first region of the substrate and a second vertical fin on a second region of the substrate, wherein an isolation region separates the first region from the second region. The devices further include a first doped well and a bottom source/drain region in the substrate below the first vertical fin. The devices further include a second doped well in the substrate below the second vertical fin. The devices further include a bottom spacer layer on the bottom source/drain region and the second doped well. The devices further include a dielectric under-layer segment on the bottom spacer layer and the second vertical fin, and a first gate dielectric layer on the dielectric under-layer segment.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming a combination of logic devices and power devices on a substrate from the same set of vertical fins. A plurality of vertical fins can be formed on the substrate and a subset of the vertical fins can be masked off to differentiate subsequently fabricated power devices from logic devices, where power devices can handle greater voltages and power than the logic devices.

Embodiments of the present invention relate generally to fabricating fin field effect transistors (FinFET) devices which can handle high voltage/power using process steps similar to those used to fabricate FinFET devices which can be low voltage/power devices, so a combination of high voltage/power devices and low voltage/power logic devices can be fabricated together and at the same time on the same substrate.

Embodiments of the present invention relate generally to forming power devices having an additional thick dielectric under-layer and an inverted T-shaped gate structure to increase the voltage/current capacity of the devices. The power devices can be vertical transport fin field effect transistors (VT FinFETs) having an additional thick dielectric under-layer as part of the electrically insulating component of a gate structure.

Embodiments of the present invention relate generally to forming power devices having an inverted T-shaped conductive region from a top source/drain, through a vertical fin channel, to a lightly doped well, and a 90 degree turn to a bottom electrical contact. A single vertical fin can be formed directly on the doped well for a power FinFET. The inverted T-shaped conductive region can control the 'ON' resistance of the power device, so it can handle greater voltages/power than a device without the inverted T-shaped conductive region. The well depth, dopant concentration, and distance from the channel to the bottom electrical contact can affect the device resistance and operating voltage range. A higher doped source/drain region may not be used in the power device.

Exemplary applications/uses to which the present invention can be applied include, but are not limited to: circuitry and devices involving a combination of power devices and control circuitry on the same substrate, for example, System-on-Chip (SoC) devices.

It is to be understood that aspects of the present invention will be described in terms of a given illustrative architecture; however, other architectures, structures, substrate materials and process features and steps can be varied within the scope of aspects of the present invention.

Figure 1:
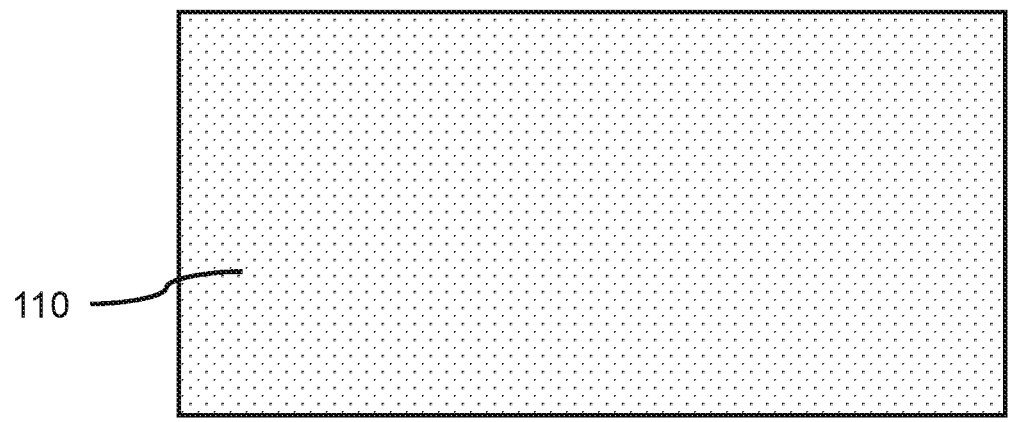
FIG. 1 is a cross-sectional side view showing a substrate, in accordance with an embodiment of the present invention.

Referring now to the drawings in which like numerals represent the same or similar elements and initially to FIG. 1, a substrate is shown, in accordance with an embodiment of the present invention In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

Figure 2:
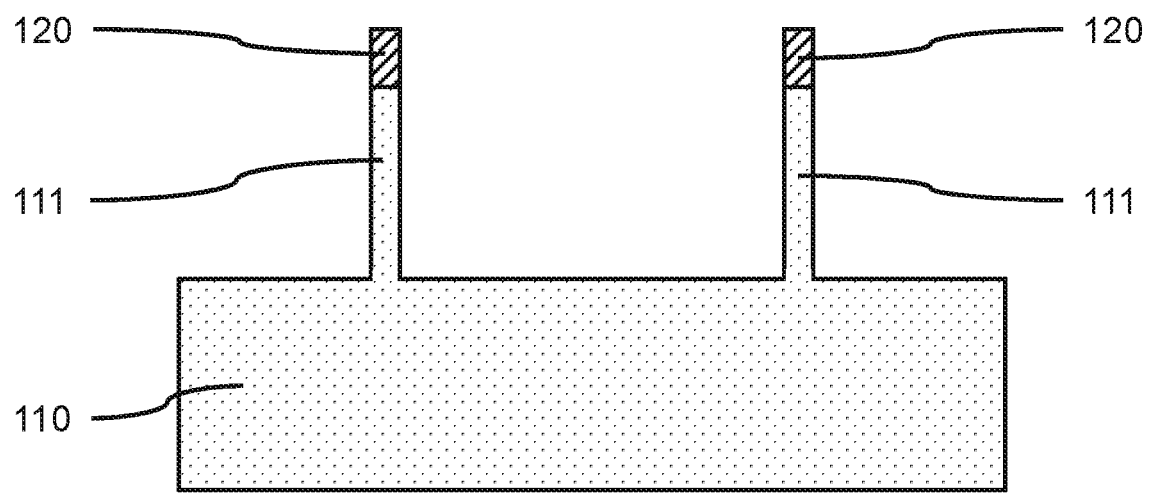
FIG. 2 is a cross-sectional side view showing a plurality of vertical fins formed on the substrate with a fin template on each of the vertical fins, in accordance with an embodiment of the present invention.

FIG. 2 is a cross-sectional side view showing a plurality of vertical fins formed on the substrate with a fin template on each of the vertical fins, in accordance with an embodiment of the present invention.

In one or more embodiments, a plurality of vertical fins 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography followed by etching.

In various embodiments, the vertical fins can have a height in the range of about 15 nm to about 100 nm, or about 15 nm to about 50 nm, or about 50 nm to about 100 nm, or about 30 nm to about 70 nm, although other heights are contemplated.

In various embodiments, a fin template 120 may be on each vertical fin 111, where the fin template 120 is formed during the patterning process. The fin templates 120 can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. A thin (i.e., <1 nm) oxide layer can be between the top surface of the vertical fin 111 and the fin template 120.

Figure 3:
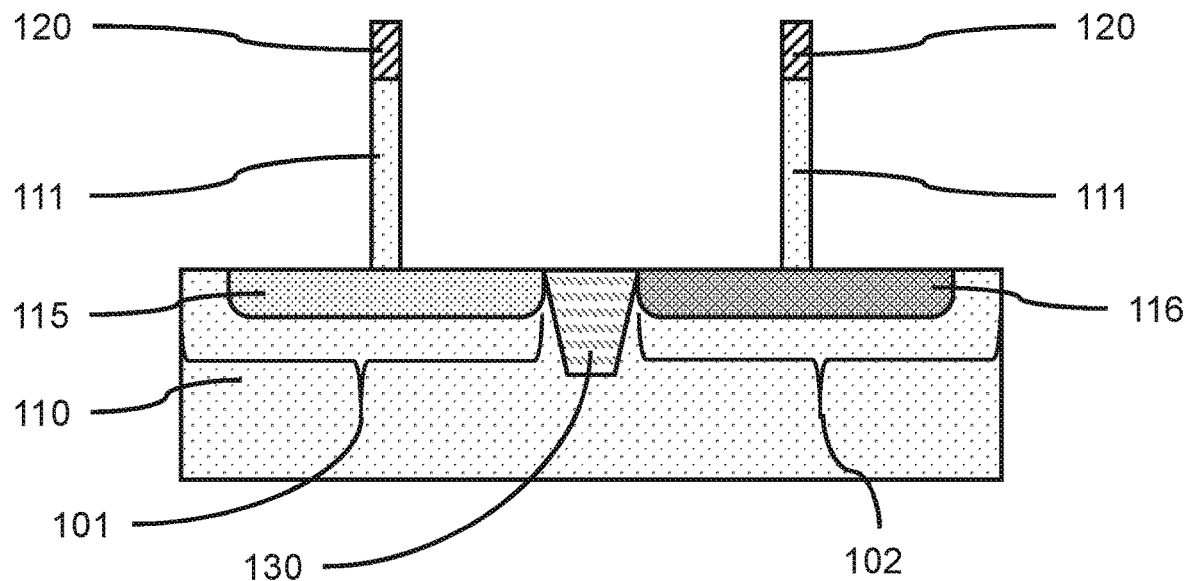
FIG. 3 is a cross-sectional side view showing an isolation region between two vertical fins, an n-type well below one of the vertical fins, and a p-type well below the other vertical fin, in accordance with an embodiment of the present invention.

FIG. 3 is a cross-sectional side view showing an isolation region between two vertical fins, an n-type well below one of the vertical fins, and a p-type well below the other vertical fin, in accordance with an embodiment of the present invention.

In one or more embodiments, an isolation region 130 (e.g., a shallow trench isolation (STI) region) can be formed in the substrate 110, where the isolation region can include an insulating dielectric material (e.g., $SiO_2$) to prevent or reduce electrical conduction between different regions of the substrate 110. The isolation region 130 can have a width of at least 50 nm, or at least 100 nm or about 50 nm to about 250 nm, or about 100 nm to about 150 nm, to physically and electrically separate adjacent regions of the substrate. One or more vertical fins 111 can be formed on each side of the isolation region 130, wherein the isolation region 130 separates the substrate into two different regions, for example, a first region 101 and a second region 102. One or more vertical fins 111 formed in the first region 101 can be configured to form a p-type logic fin field effect transistor (FinFET), and one or more vertical fins 111 formed in the second region 102 can be configured to form an n-type power fin field effect transistor, although the arrangement and/or dopant type can be reversed.

In one or more embodiments, dopants can be introduced into the substrate 110 to form doped wells 115, 116. A p-type dopant can be introduced into the substrate 110 in the first region 101 to form a p-type doped well 115, and an n-type dopant can be introduced into the substrate in the second region 102 to form an n-type doped well 116. In various embodiments the dopants can be reversed. P-type dopants can include, but not be limited to, boron (B), aluminum (Al), gallium (Ga), and indium (In). N-type dopants can include, but not be limited to, phosphorus (P), arsenic (s), and antimony (Sb). Dopants (n-type or p-type) can be incorporated by suitable doping techniques, including but not limited to, ion implantation, gas phase doping, plasma doping, plasma immersion ion implantation, cluster doping, infusion doping, liquid phase doping, solid phase doping, etc. The doped wells 115, 116 can be adjacent to the isolation region 130, where the doped wells 115, 116 can be shallower than the isolation region 130. The doped wells 115, 116 can be below the vertical fins 111, where the doped wells extend laterally beyond the interfacial area of the one or more vertical fins 111. The doped well 116 for a power FinFET can have a depth into the substrate 110 in a range of about 30 nm to about 150 nm, or about 50 nm to about 100 nm, although other depths are also contemplated. Changing the depth of the doped well 116 can alter the device resistance and operating voltage of the power device. The doped well 115 for a logic FinFET can have a depth into the substrate 110 in a range of about 20 nm to about 100 nm, or about 20 nm to about 60 nm, or about 50 nm to about 100 nm, although other depths are also contemplated.

In various embodiments, the p-type doped well 115 can have a dopant concentration in the range of about $1\times10^{17}$ atoms/cm$^3$ to about $1\times10^{19}$ atoms/cm$^3$, or about $5\times10^{17}$ atoms/cm$^3$ to about $5\times10^{18}$ atoms/cm$^3$. In various embodiments, the n-type doped well 116 can have a dopant concentration in the range of about $1\times10^{17}$ atoms/cm$^3$ to about $1\times10^{19}$ atoms/cm$^3$, or about $5\times10^{17}$ atoms/cm$^3$ to about $5\times10^{18}$ atoms/cm$^3$. A doped well 115, 116 can have a lower dopant concentration to provide for higher voltages across the device channel. By controlling the dopant concentrations of the p-type doped well 115 and n-type doped well 116, a logic device and a power device can be formed on the same substrate 110 using essentially the same process steps. A power device can have an operating voltage in a range of about 3 volts (V) to about 10 V, whereas a logic (i.e., low voltage) device can have an operating voltage in a range of about 0.5 V to about 2 V. In various embodiments, a lower dopant concentration of the n-type doped well 116 can form the power device(s), while the higher dopant concentration p-type doped well 115 can form the logic device(s). This also provides fabrication efficiencies and greater leeway in forming electronic devices on the same substrate (e.g., system-on-chip).

Figure 4:
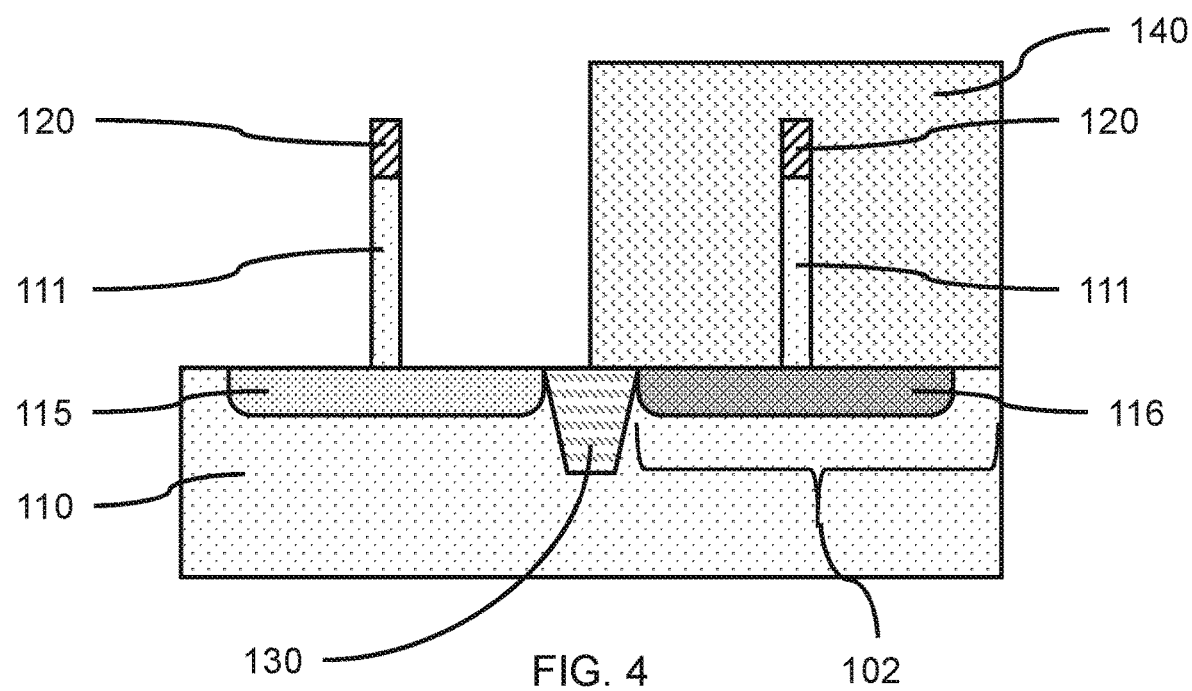
FIG. 4 is a cross-sectional side view showing a masking block covering one of the vertical fins and the n-type well, in accordance with an embodiment of the present invention.

FIG. 4 is a cross-sectional side view showing a masking block covering one of the vertical fins and the n-type well, in accordance with an embodiment of the present invention.

In one or more embodiments, a masking layer can be formed on the vertical fins 111, isolation region 130, and the substrate 110, where the masking layer can be formed by a blanket deposition (e.g., CVD, spin-on). The masking layer can extend above the top surface of the fin templates 120, and a chemical mechanical polishing (CMP) used to reduce the height and provide a planarized surface. The masking layer can be a soft mask material, for example, a lithography resist material, such as a polymeric material (e.g. poly (methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

In various embodiments, the masking layer can be a hard mask comprising a dielectric material such as silicon nitride (SiN), silicon oxide (SiO), a silicon oxynitride (SiON), a silicon carbide (SiC), a silicon oxygen carbonitride (SiOCN), or a silicoboron carbonitride (SiBCN). In various embodiments, the masking layer is a silicon nitride. In various embodiments, the masking layer can have a thickness of about 10 nm to about 100 nm, or about 10 nm to about 30 nm, although other thicknesses are also contemplated. The masking layer can have a thickness of about 100 nm.

In various embodiments, the masking layer can be patterned to form a masking block 140 covering the vertical fins 111 and the n-type doped well 116 in the second region 102 by lithographic methods. A portion of the masking layer can be removed to expose the vertical fins 111 and p-type doped well 115 in the first region 101. A portion of the isolation region 130 may be exposed and a portion of the isolation region 130 may be masked. The masking block 140 can extend above the top surface of the fin templates.

Figure 5:
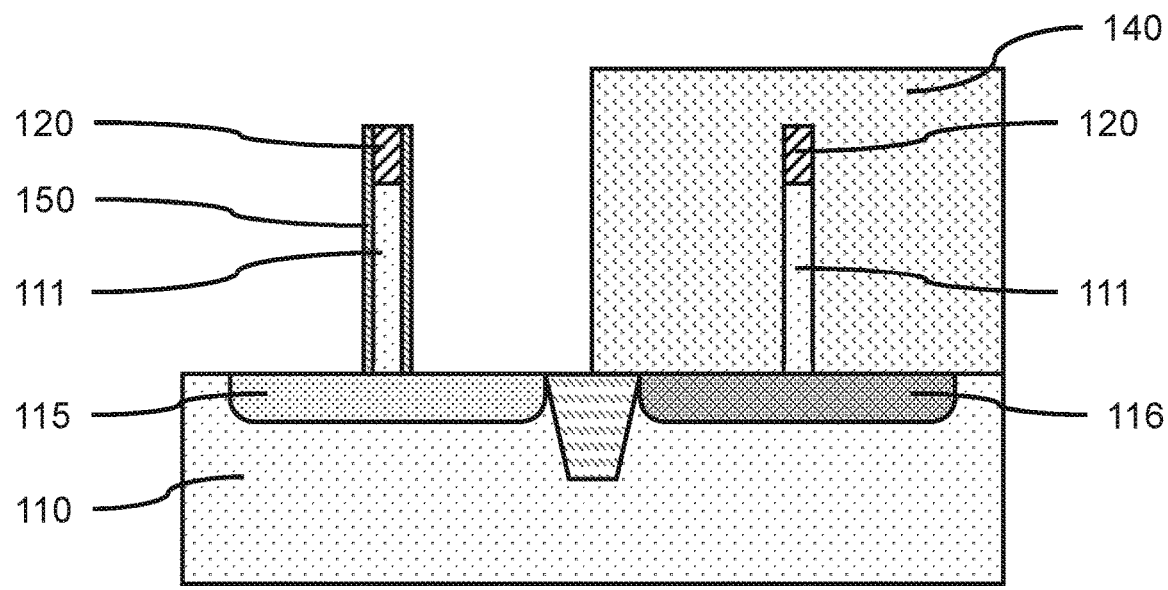
FIG. 5 is a cross-sectional side view showing a liner layer on the sidewalls of the exposed vertical fin, in accordance with an embodiment of the present invention.

FIG. 5 is a cross-sectional side view showing a liner layer on the sidewalls of the exposed vertical fin, in accordance with an embodiment of the present invention.

In one or more embodiments, a liner layer 150 can be formed on the sidewalls and endwalls of the exposed vertical fins 111, where the exposed vertical fins 111 can be on the first region 101. The liner layer 150 can be formed by a conformal deposition (e.g., atomic layer deposition (ALD), plasma enhanced ALD (PEALD), chemical vapor deposition (CVD), plasma enhanced CVD (PECVD), or a combination thereof, to a predetermined thickness. In various embodiments, the liner layer 150 can have a thickness in the range of about 3 nm to about 15 nm, or in the range of about 4 nm to about 8 nm, where the liner layer can be thick enough to prevent penetration of dopants into the vertical fins 111.

Figure 6:
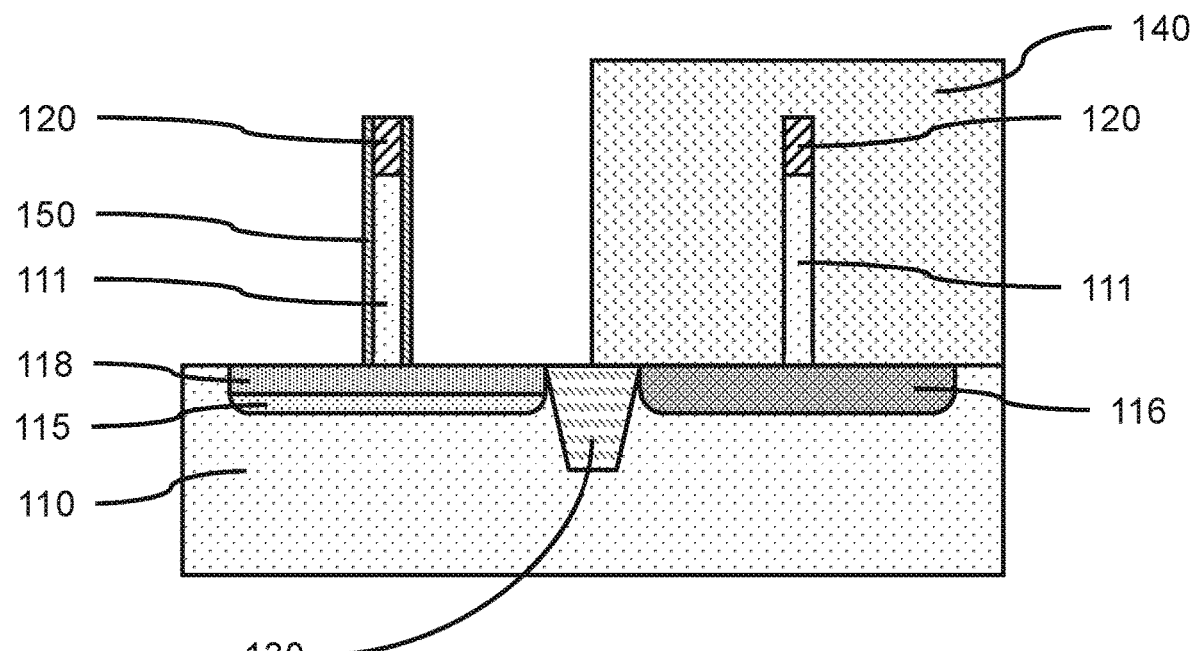
FIG. 6 is a cross-sectional side view showing a source/drain region formed in the p-type well, in accordance with an embodiment of the present invention.

FIG. 6 is a cross-sectional side view showing a bottom source/drain region formed in the p-type well, in accordance with an embodiment of the present invention.

In various embodiments, a bottom source/drain region 118 can be formed in the substrate 110, where the bottom source/drain region 118 can be formed in a p-type well 115 or an n-type well 116. Dopants (n-type or p-type) can be incorporated by suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain region 118 can be doped to form n-type or p-type source/drains to fabricate NFETs or PFETs. The dopant forming the bottom source/drain region 118 can be the opposite type as the doped well 115 in the first region 101, such that the doped well 115 can form a punch-through stop layer. In various embodiments, phosphorus doped silicon can be used as the bottom source/drain region 118 for NFETs. A p-type doped well and an n-type bottom source/drain region 118 can be formed in the substrate 110 below the vertical fin 111 on the first region 101, and an n-type doped well 116 can be formed in the substrate 110 below the vertical fin 111 on the second region 102, where a bottom source/drain region may not be formed in the doped well 116. In various embodiments the dopants can be reversed, such that a p-type bottom source/drain region 118 can be formed in an n-type doped well 116, and a p-type doped well can be used for a power device. In various embodiments, a bottom source/drain region is not formed in the doped well for the power device. A vertical fin 111 can be directly on a doped well 115, 116.

In various embodiments, the bottom source/drain region 118 can have a dopant concentration in the range of about $1\times10^{18}$ atoms/cm$^3$ to about $1\times10^{21}$ atoms/cm$^3$, or about $1\times10^{19}$ atoms/cm$^3$ to about $5\times10^{20}$ atoms/cm$^3$, although other concentrations are also contemplated. The dopant concentration of the bottom source/drain region 118 can be sufficient to counteract the opposite doping of the doped well 115. In various embodiments, the dopant concentration of the bottom source/drain region 118 can be at least 5 times (5×) the dopant concentration of the doped well 115 and/or doped well 116.

In various embodiments, the bottom source/drain region 118 can have a depth into the substrate 110 and doped well 115 in the range of about 20 nm to about 60 nm, or about 30 nm to about 50 nm. Other depths that are lesser than, or greater than, the aforementioned depth ranges may also be employed. The depth into the substrate of the doped well 115 can be in the range of about 20 nm to about 60 nm, or about 50 nm to about 100 nm, where the depth into the substrate of the doped well 115 is greater than the depth of the bottom source/drain region 118. The doped well 115 can surround the bottom source/drain region 118 to form a punch-through stop around the bottom source/drain region. The doped well 116 in the second region 102 may not be modified or have a bottom source/drain region formed.

Figure 7:
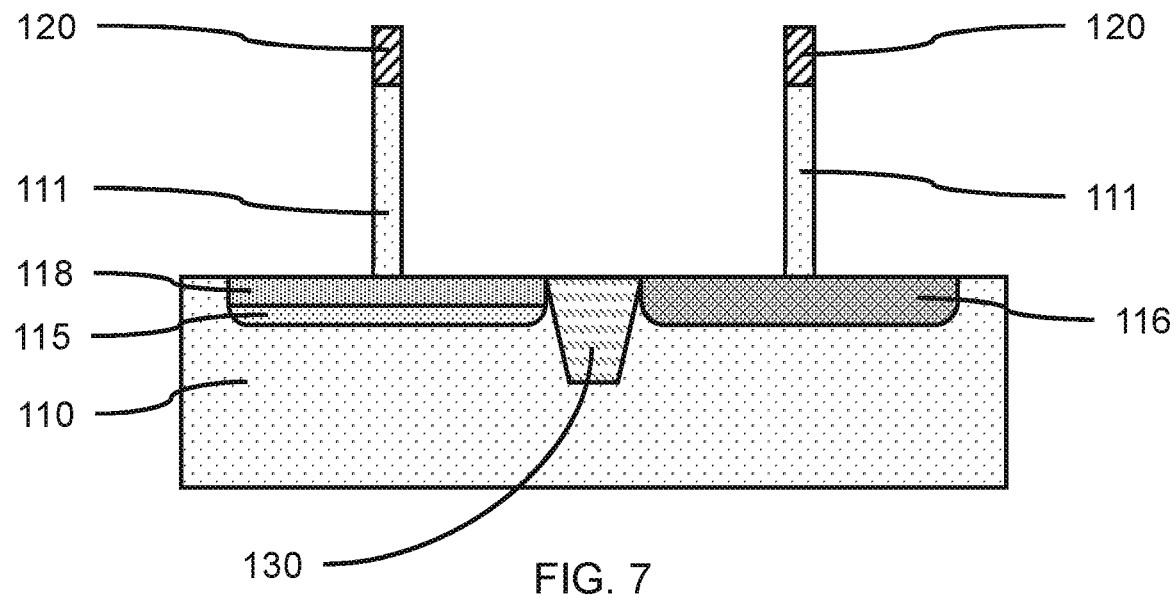
FIG. 7 is a cross-sectional side view showing the exposed vertical fins after removing the masking block and the liner layer, in accordance with an embodiment of the present invention.

FIG. 7 is a cross-sectional side view showing the exposed vertical fins after removing the masking block and the liner layer, in accordance with an embodiment of the present invention.

In one or more embodiments, the masking block 140 can be removed from the one or more vertical fins 111 on the doped well 116 in the second region 102. The masking block 140 can be removed using a selective etch or ashing depending on the material of the masking block. Removal of the masking block 140 can expose the vertical fins 111 and doped well 116 in the second region 102.

Figure 8:
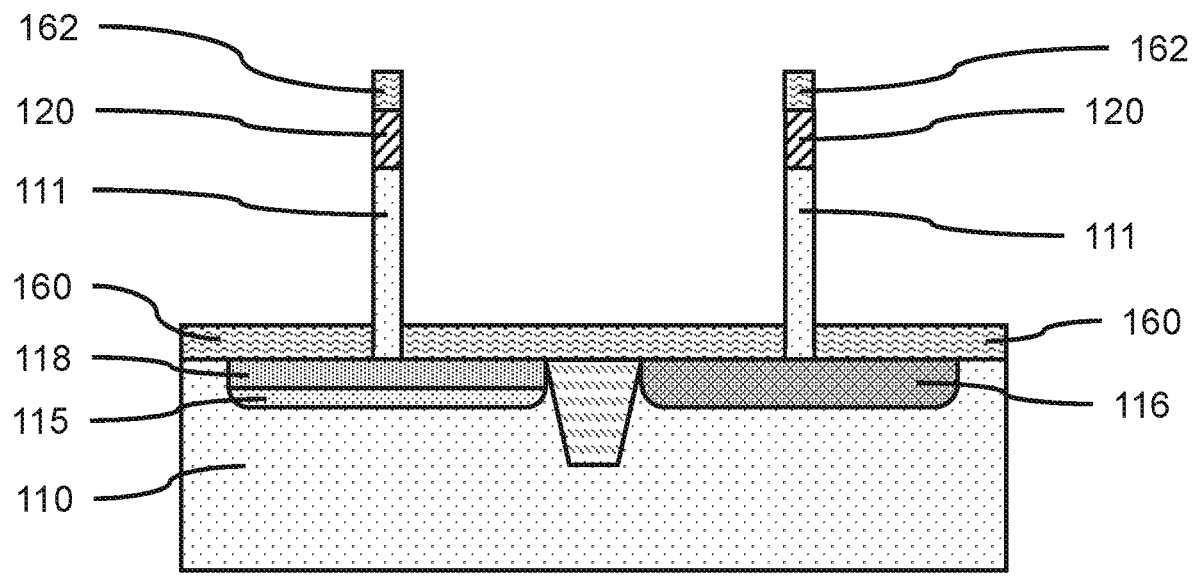
FIG. 8 is a cross-sectional side view showing a bottom spacer layer on the source/drain region, isolation region, and n-type well, and spacer caps on the fin templates, in accordance with an embodiment of the present invention.

FIG. 8 is a cross-sectional side view showing a bottom spacer layer on the source/drain region, isolation region, and n-type doped well, and spacer caps on the fin templates, in accordance with an embodiment of the present invention.

In one or more embodiments, a bottom spacer layer 160 can be formed on the surface of the substrate 110, the source/drain region 118, the isolation region 130, and doped well 116, as well as on a lower portion of the vertical fins in both the first and second regions 101, 102. Spacer caps 162 can be formed on the fin templates 120.

In various embodiments, the bottom spacer layer 160 can be formed by a directional deposition, for example, a high density plasma CVD (HDPCVD), physical vapor deposition (PVD), or gas cluster ion beam (GCIB), or a blanket deposition and etch-back. In embodiments that use PVD, a sputtering apparatus may include direct-current diode systems, radio frequency sputtering, magnetron sputtering, or ionized metal plasma sputtering. In embodiments that use GCIB deposition, a high-pressure gas is allowed to expand in a vacuum, subsequently condensing into clusters. The clusters can be ionized and directed onto a surface, providing a highly anisotropic deposition.

In various embodiments, the material of the bottom spacer layer 160 can be a dielectric material including, but not be limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. Other examples include, Applied Material's Black Diamond™.

In various embodiments, the bottom spacer layer 160 can have a thickness in the range of about 3 nm to about 15 nm, or in the range of about 5 nm to about 10 nm, or about 3 nm to about 5 nm, although other thicknesses are contemplated.

Figure 9:
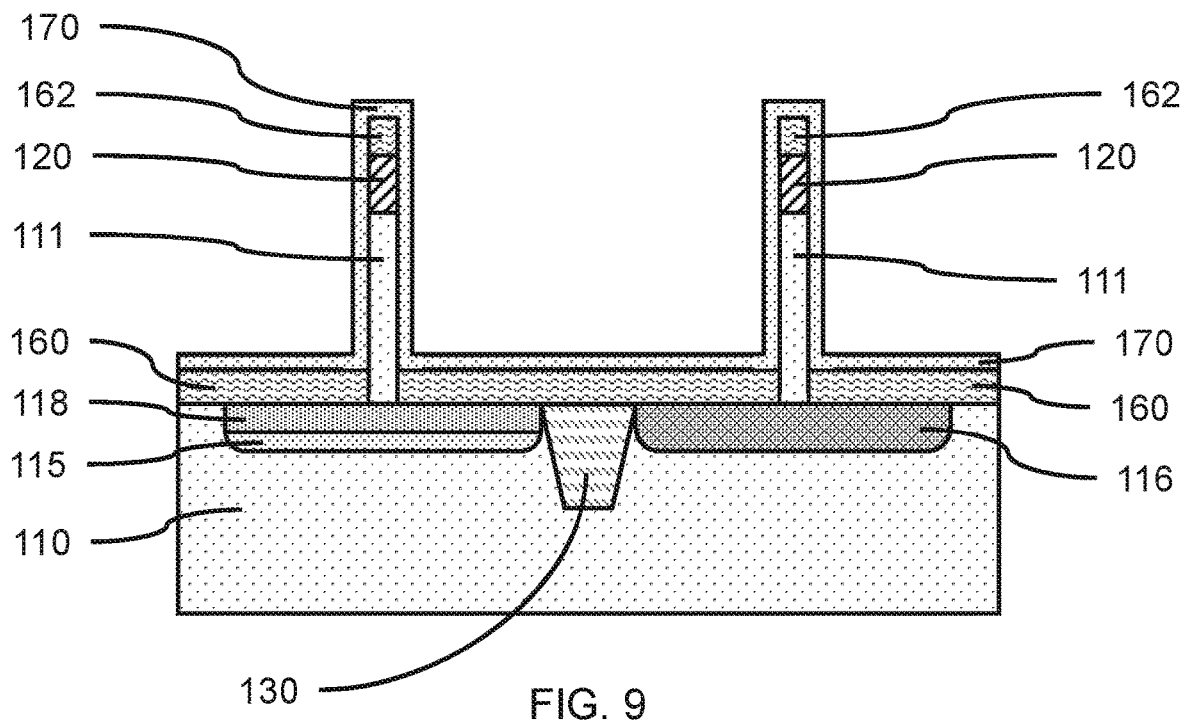
FIG. 9 is a cross-sectional side view showing a dielectric under-layer on the vertical fins, spacer caps, and bottom spacer layer, in accordance with an embodiment of the present invention.

FIG. 9 is a cross-sectional side view showing a dielectric under-layer on the vertical fins, spacer caps, and bottom spacer layer, in accordance with an embodiment of the present invention.

In one or more embodiments, a dielectric under-layer 170 can be formed on the exposed portions of the vertical fins 111 and bottom spacer layer 160, where the dielectric under-layer 170 can be formed by a conformal deposition (e.g., ALD, PEALD).

In an embodiment dielectric under-layer 170 may be deposited using various deposition techniques, for example, nitridation, atomic layer deposition (ALD), molecular layer deposition (MLD), chemical vapor deposition (CVD), physical vapor deposition (PVD), and spin on techniques. In an alternate embodiment the dielectric under-layer 170 may be deposited using thermal oxidation as a deposition technique. In this alternate embodiment dielectric under-layer 170 is formed on exposed surfaces of the fin, and dielectric under-layer 170 is not formed in the inactive region which is already covered by dielectric material (e.g., oxide). In an embodiment, the dielectric under-layer 170 may include one or more layers. In an embodiment, dielectric under-layer 170 may have a thickness in a range of about 1 nm to 25 nm, or about 2 nm to 20 nm, or about 4 nm to 15 nm, or ranges there between, although other thicknesses are also contemplated.

In various embodiments, the dielectric under-layer 170 can have a thickness in the range of about 5 nm to about 20 nm, or in the range of about 6 nm to about 15 nm, or in the range of about 7 nm to about 10 nm. Other thicknesses that are lesser than, or greater than, the aforementioned thickness range may also be employed.

In various embodiments, the material of the dielectric under-layer 170 can be silicon oxide (SiO), silicon oxynitride (SiON), silicon boro carbonitride (SiBCN), silicon oxycarbonitride (SiOCN), a high-K dielectric material, or combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

Figure 10:
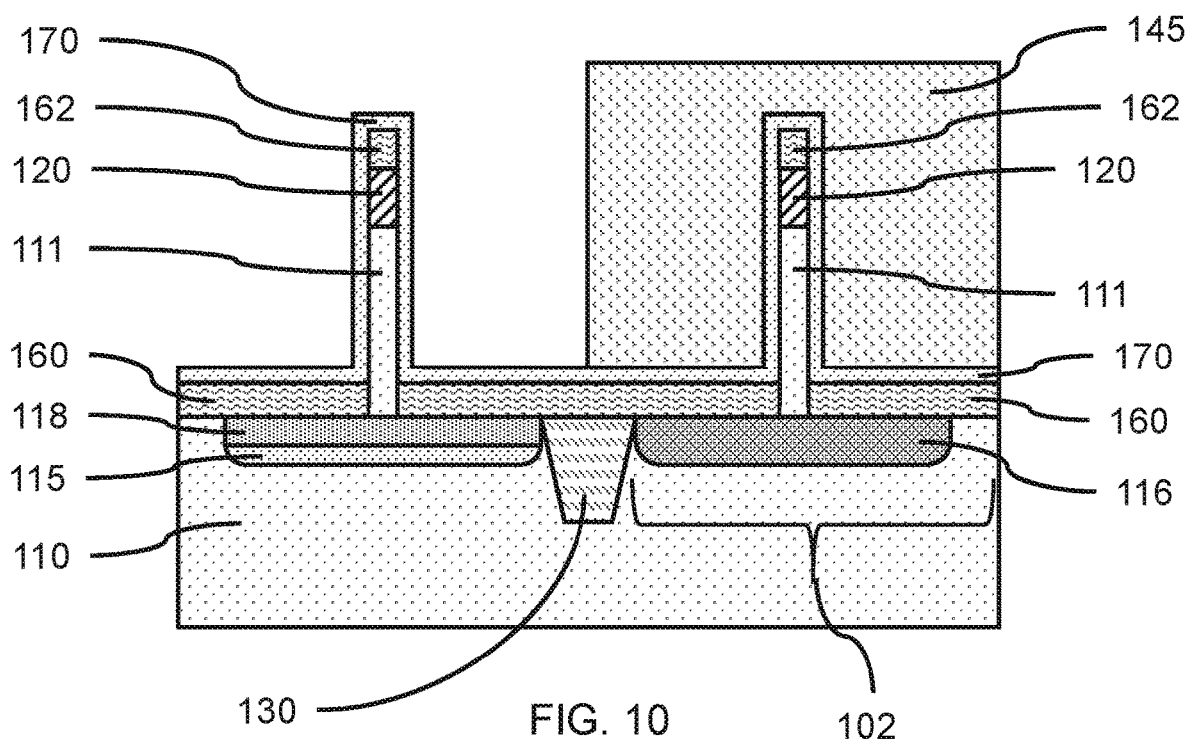
FIG. 10 is a cross-sectional side view showing a second masking block on the vertical fin on the n-type well, in accordance with an embodiment of the present invention.

FIG. 10 is a cross-sectional side view showing a second masking block on the vertical fin on the n-type well, in accordance with an embodiment of the present invention.

In one or more embodiments, a second masking block 145 can be formed on the dielectric under-layer 170 and the vertical fins 111 in the second region 102. A portion of the dielectric under-layer 170 can be exposed in the first region 101.

Figure 11:
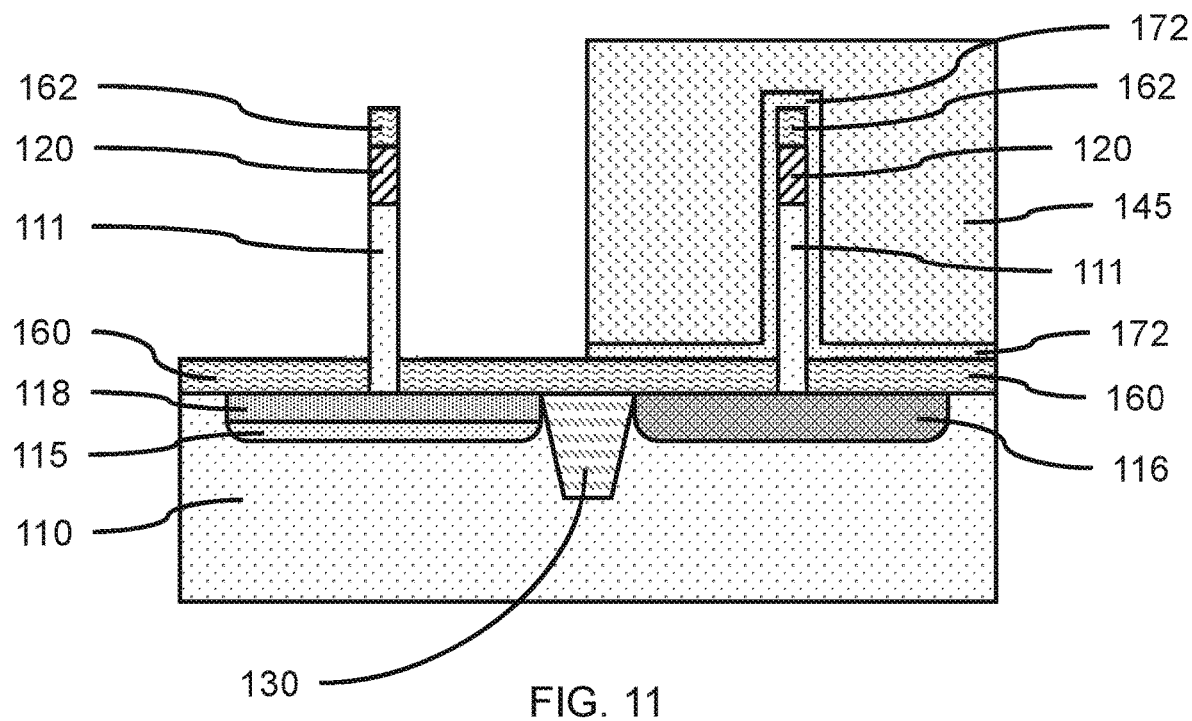
FIG. 11 is a cross-sectional side view showing the exposed vertical fin on the bottom source/drain region after removing the exposed portion of the dielectric under-layer, in accordance with an embodiment of the present invention.

FIG. 11 is a cross-sectional side view showing the exposed vertical fin on the source/drain region after removing the exposed portion of the dielectric under-layer, in accordance with an embodiment of the present invention.

In one or more embodiments, the exposed portion of the dielectric under-layer 170 can be removed, for example, using an isotropic etch (e.g., wet chemical etch, dry plasma etch) to form a dielectric under-layer segment 172, and expose the underlying bottom spacer layer 160, vertical fins 111, fin templates 120, and spacer caps 162. In various embodiments, the dielectric under-layer 170 is a different material than the bottom spacer layer 160, so portions of the dielectric under-layer 170 can be selectively removed.

Figure 12:
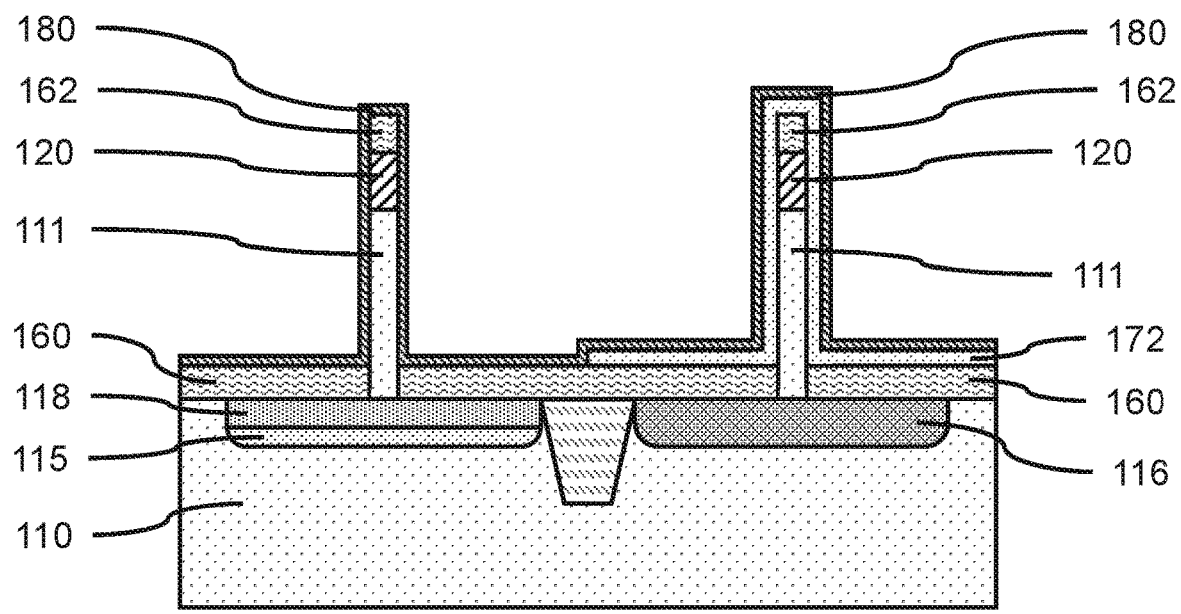
FIG. 12 is a cross-sectional side view showing a gate dielectric layer formed on the exposed vertical fin and the exposed dielectric under-layer segment after removing the second masking block, in accordance with an embodiment of the present invention.

FIG. 12 is a cross-sectional side view showing a gate dielectric layer formed on the exposed vertical fin and the exposed dielectric under-layer segment after removing the second masking block, in accordance with an embodiment of the present invention.

In one or more embodiments, a gate dielectric layer 180 can be formed on the exposed vertical fins 111 and the exposed dielectric under-layer segment 172 on the vertical fin in the second region 102 after removing the second masking block 145. The gate dielectric layer 180 can be formed by a conformal deposition (e.g., ALD, PEALD).

In one or more embodiments, a gate dielectric layer 180 can be silicon oxide (SiO), silicon nitride (SiN), silicon oxynitride (SiON), boron nitride (BN), high-k dielectric materials, or a combination thereof.

In various embodiments, the gate dielectric layer 180 can have a thickness in the range of about 7 Å to about 30 Å, or about 7 Å to about 10 Å, or about 1 nm to about 2 nm, although other thicknesses are contemplated.

Figure 13:
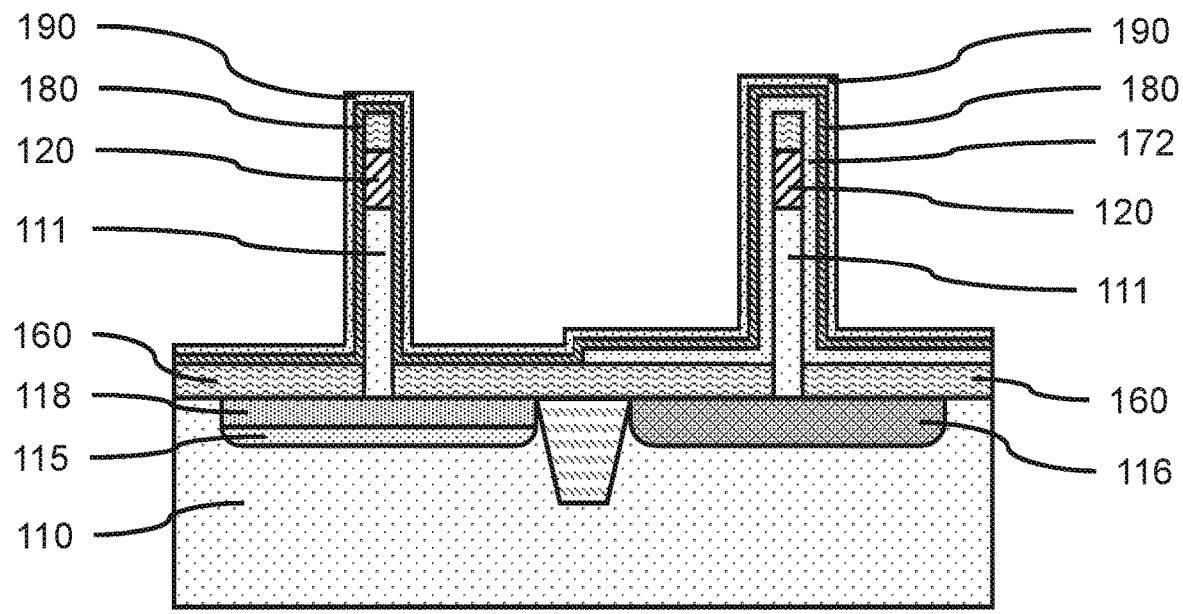
FIG. 13 is a cross-sectional side view showing a work function layer on the gate dielectric layer, in accordance with an embodiment of the present invention.

FIG. 13 is a cross-sectional side view showing a work function layer on the gate dielectric layer, in accordance with an embodiment of the present invention.

In one or more embodiments, a work function material (WFM) can form a work function layer 190 on a portion of the gate dielectric layer 180 to form a gate structure for a fin field effect transistor (FinFET) or power FinFET. The work function layer 190 can be deposited on the gate dielectric layer 180 by a conformal deposition. In various embodiments, the current can flow vertically from the bottom source/drain region 118 or a doped well 116 through a channel region formed by the vertical fin 111 and the gate structure to a top source/drain.

In various embodiments, the work function layer 190 can include, but not necessarily be limited to, titanium nitride (TiN), tantalum nitride (TaN) or ruthenium (Ru), for a PFET. The work function layer 190 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN, for an NFET.

The work function layer 190 can have a thickness in the range of about 2 nm to about 10 nm, or about 3 nm to about 6 nm, although other thicknesses are contemplated.

Figure 14:
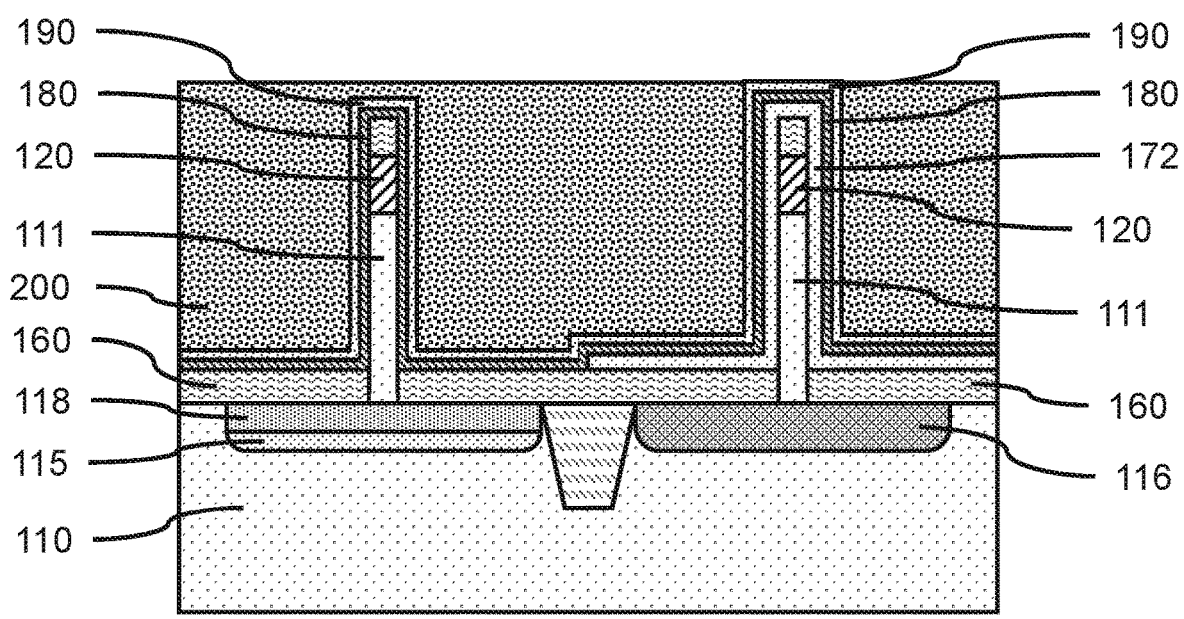
FIG. 14 is a cross-sectional side view showing a conductive gate fill on the work function layer, in accordance with an embodiment of the present invention.

FIG. 14 is a cross-sectional side view showing a conductive gate fill on the work function layer, in accordance with an embodiment of the present invention.

In one or more embodiments, a conductive gate fill 200 can be formed on at least a portion of the work function layer 190 or gate dielectric layer 180 if the work function layer is not present. The conductive gate fill 200 can be formed by a blanket deposition, and a CMP can be used to remove excess material.

In various embodiments, the conductive gate fill 200 can include, but not necessarily be limited to, amorphous silicon (a-Si), or metals, for example, tungsten (W), cobalt (Co), zirconium (Zr), tantalum (Ta), titanium (Ti), aluminum (Al), ruthenium (Ru), copper (Cu), metal carbides (e.g., TaC, TiC, WC, etc.), metal nitrides (e.g., TaN, ZrN, etc.), transition metal aluminides (e.g., TiAl, CoAl, NiAl, etc.), tantalum magnesium carbide, or combinations thereof. The conductive gate fill 200 can be deposited on the work function layer 190, or the gate dielectric layer 180 if a work function layer is not present, to form the gate structure.

Figure 15:
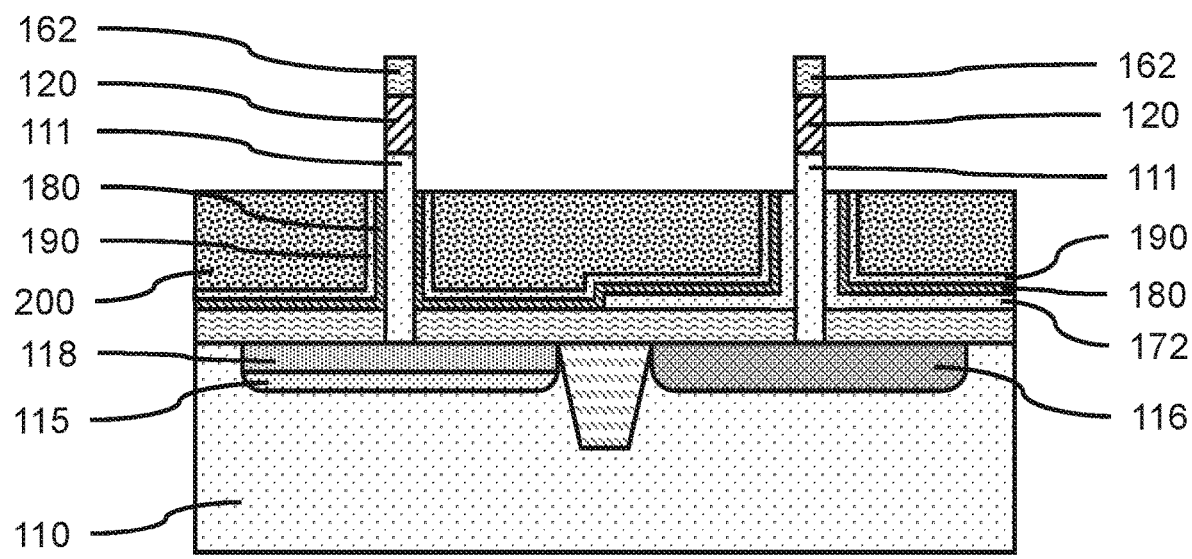
FIG. 15 is a cross-sectional side view showing the gate dielectric layer, work function layer, and conductive gate fill with reduced heights, in accordance with an embodiment of the present invention.

FIG. 15 is a cross-sectional side view showing the gate dielectric layer, work function layer, and conductive gate fill with reduced heights, in accordance with an embodiment of the present invention.

In one or more embodiments, the height of the conductive gate fill 200 can be reduced using, for example, a directional etch (e.g., reactive ion etch (RIE)). The exposed portion of the work function layer 190 can be removed using a selective etch, and the exposed portion of the gate dielectric layer 180 can be removed using a selective etch to expose an upper portion of the vertical fins 111.

Figure 16:
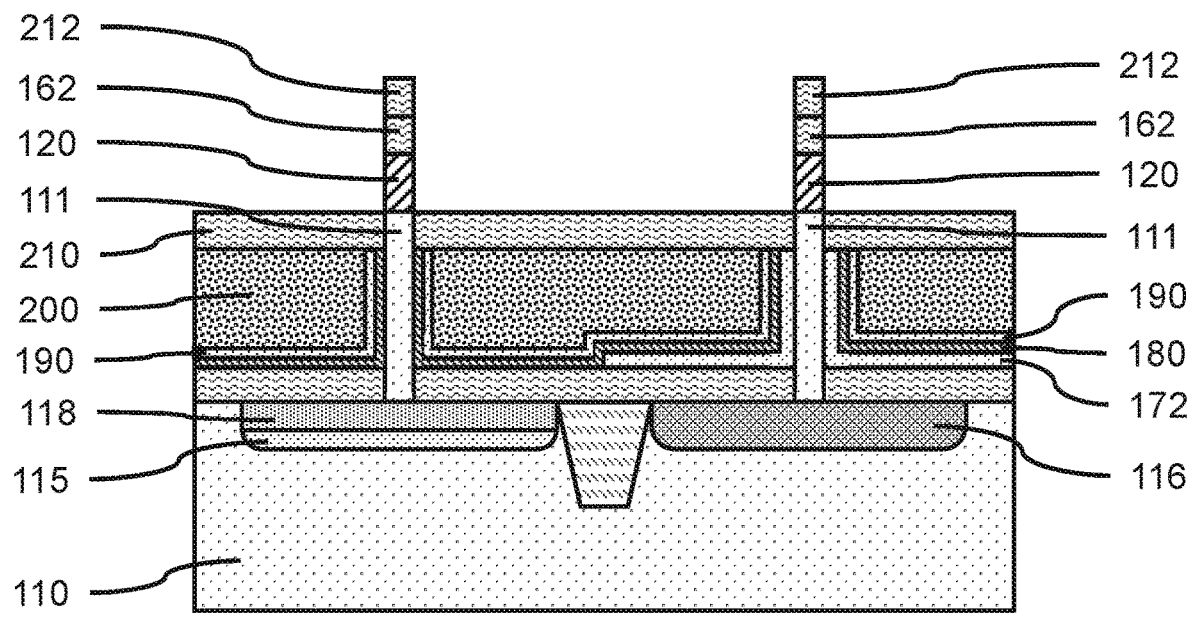
FIG. 16 is a cross-sectional side view showing a top spacer layer formed on the conductive gate fill, work function, layer, and gate dielectric layer, and a second set of spacer caps on the first spacer caps, in accordance with an embodiment of the present invention.

FIG. 16 is a cross-sectional side view showing a top spacer layer formed on the conductive gate fill, work function layer, and gate dielectric layer, and a second set of spacer caps on the first spacer caps, in accordance with an embodiment of the present invention.

In one or more embodiments, a top spacer layer 210 can be formed on the conductive gate fill 200, work function layer 190, and gate dielectric layer 180, and a second set of spacer caps 212 can be formed on the first spacer caps 162. In various embodiments, the top spacer layer 210 can be formed by a directional deposition, for example, a high density plasma CVD (HDPCVD) or gas cluster ion beam (GCIB). The top spacer layer 210 can cover the exposed upper portion of the vertical fins 111, where the top surface of the top spacer layer 210 can be at, above, or below the top surface of the vertical fins 111.

In various embodiments, the material of the top spacer layer 210 can be a dielectric material, including, but not be limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof.

In another embodiments, an organic planarization layer (OPL) can be formed on the conductive gate fill 200, and patterned to expose portion of the conductive gate fill 200, which can then be removed, followed by removal of the work function layer. A top spacer layer 210 can be formed on the remaining portions of the conductive gate fill 200.

Figure 17:
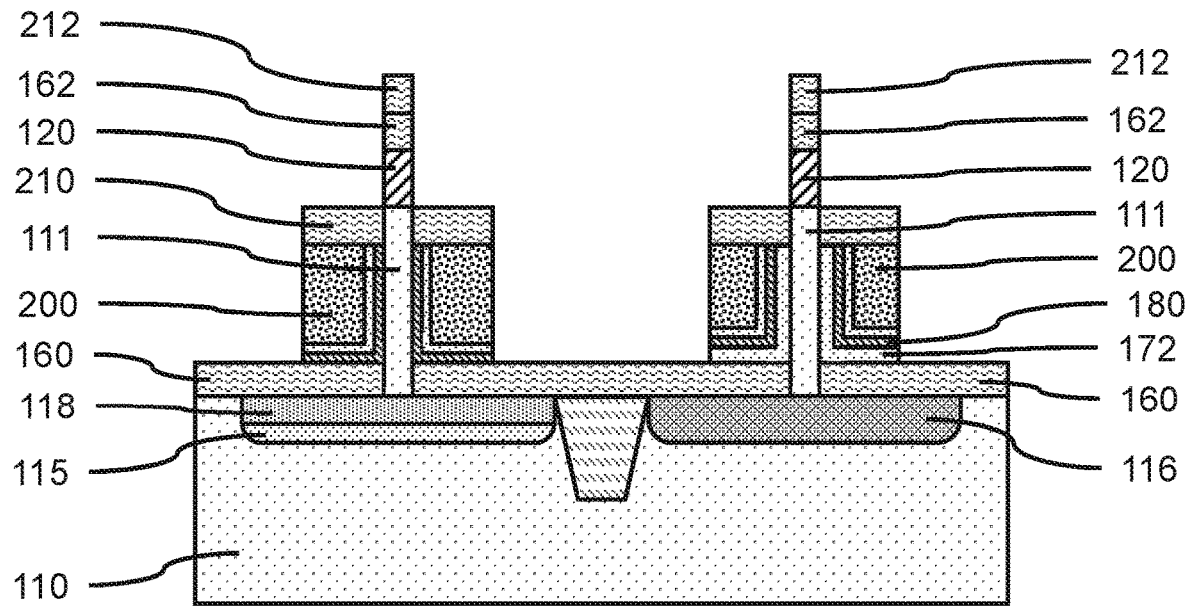
FIG. 17 is a cross-sectional side view showing top spacers on patterned gate structures formed from the gate dielectric layer, work function layer, and conductive gate fill, in accordance with an embodiment of the present invention.

FIG. 17 is a cross-sectional side view showing top spacers on patterned gate structures formed from the gate dielectric layer, work function layer, and conductive gate fill, in accordance with an embodiment of the present invention.

In one or more embodiments, the top spacer layer 210, conductive gate fill 200, work function layer 190 and gate dielectric layer 180 can be masked and etched to form a logic FinFET in the first region 101, and a power FinFET in the second region 102. The layers can be divided to form a gate structure for the power FinFET, including a first gate dielectric layer, first work function layer, and first conductive gate fill, and a gate structure for the logic FinFET, including a second gate dielectric layer, second work function layer, and second conductive gate fill. The gate structure of the power FinFET can have an inverted T-shape due to the formation of the dielectric under-layer segment 172 and gate dielectric layer 180 on the bottom spacer layer 160 before removal of portions of the top spacer layer 210, conductive gate fill 200, work function layer 190, gate dielectric layer 180, and dielectric under-layer segment 172. The gate structure of the logic FinFET also can have an inverted T-shape due to the formation of the gate dielectric layer 180 on the bottom spacer layer 160 before removal of portions of the top spacer layer 210, conductive gate fill 200, work function layer 190, gate dielectric layer.

A trench can be formed between a gate structure in the first region 101 and a gate structure in the second region 102, where the trench can be over the isolation region 130 to physically and electrically separate the gate structure on the first region from the gate structure on the second region.

Figure 18:
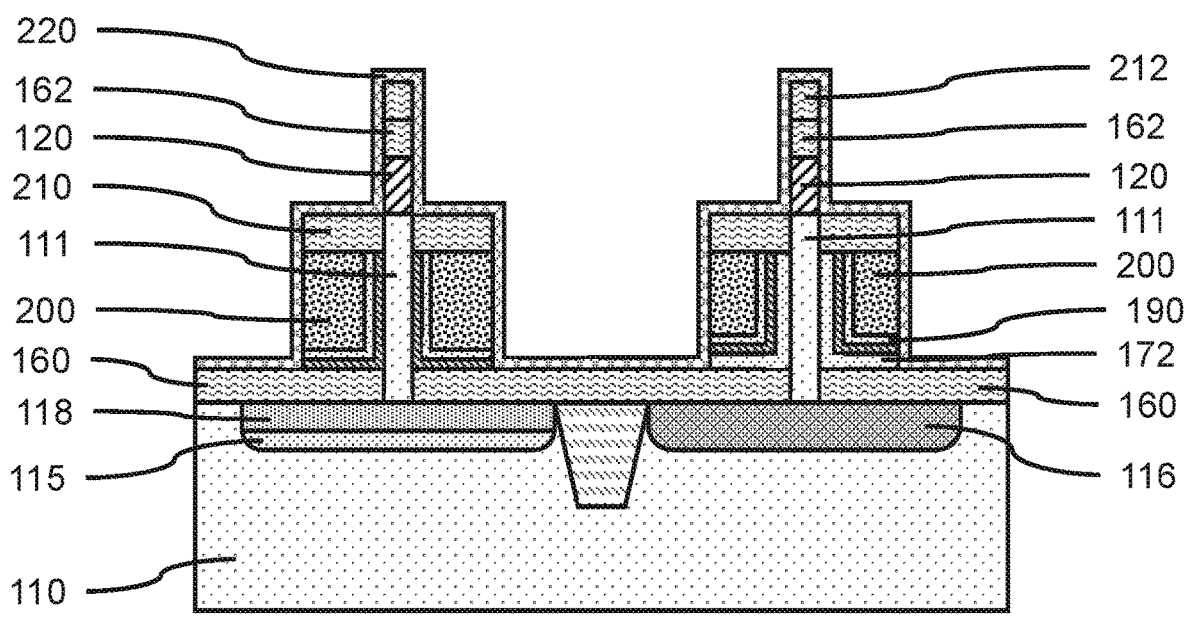
FIG. 18 is a cross-sectional side view showing a barrier layer on the gate structures and bottom spacer layer, in accordance with an embodiment of the present invention.

FIG. 18 is a cross-sectional side view showing a barrier layer on the gate structures and bottom spacer layer, in accordance with an embodiment of the present invention.

In one or more embodiments, a barrier layer 220 can be formed on the gate structures and bottom spacer layer, where the barrier layer can be formed by a conformal deposition. The barrier layer 220 can be formed using a conformal deposition process, for example, atomic layer deposition (ALD) or plasma-enhanced chemical vapor deposition (PECVD), although other suitable conformal deposition processes may be used. The barrier layer 220 can be made of silicon nitride (SiN), silicon carbonitride (SiCN), silicon boron nitride (SiBN), a doped nitride, silicon oxynitride (SiON), or combinations thereof. In various embodiments, the barrier layer 220 may be made of silicon nitride. The barrier layer 220 can have a uniform thickness ranging from about 3 nm to about 10 nm. The barrier layer 220 can be sufficiently thick to prevent diffusion of material from the conductive gate fill 200 into an interlayer dielectric (ILD) layer.

Figure 19:
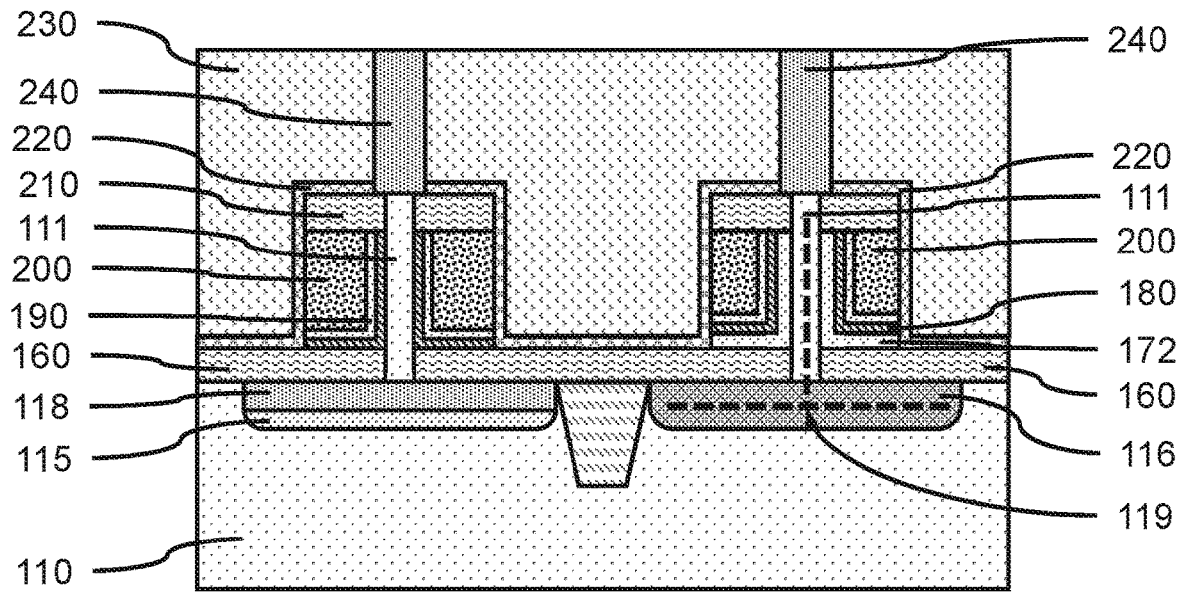
FIG. 19 is a cross-sectional side view showing a top source/drain formed on each of the vertical fins, in accordance with an embodiment of the present invention.

FIG. 19 is a cross-sectional side view showing a top source/drain formed on each of the vertical fins, in accordance with an embodiment of the present invention.

In one or more embodiments, and ILD layer 230 can be formed on the barrier layer 220, where the ILD layer 230 can be formed by a blanket deposition and a CMP used to exposed a portion of the barrier layer 220. The ILD layer can be a dielectric (e.g., SiO, SiO:C, etc.).

In various embodiments, an exposed portion of the barrier layer 220 can be removed to expose the underlying second spacer caps 212. The second spacer caps 212 and first spacer caps 162 can be selectively removed to expose the fin template 120, and the fin template 120 can be removed to form an opening over the top surface of the vertical fins 111. The second spacer caps and first spacer caps can be the same material.

In one or more embodiments, a top source/drain 240 can be formed on each of the vertical fins 111. The top source/drain 240 can be formed by epitaxial growth on the exposed surface of the vertical fin 111.

Figure 20:
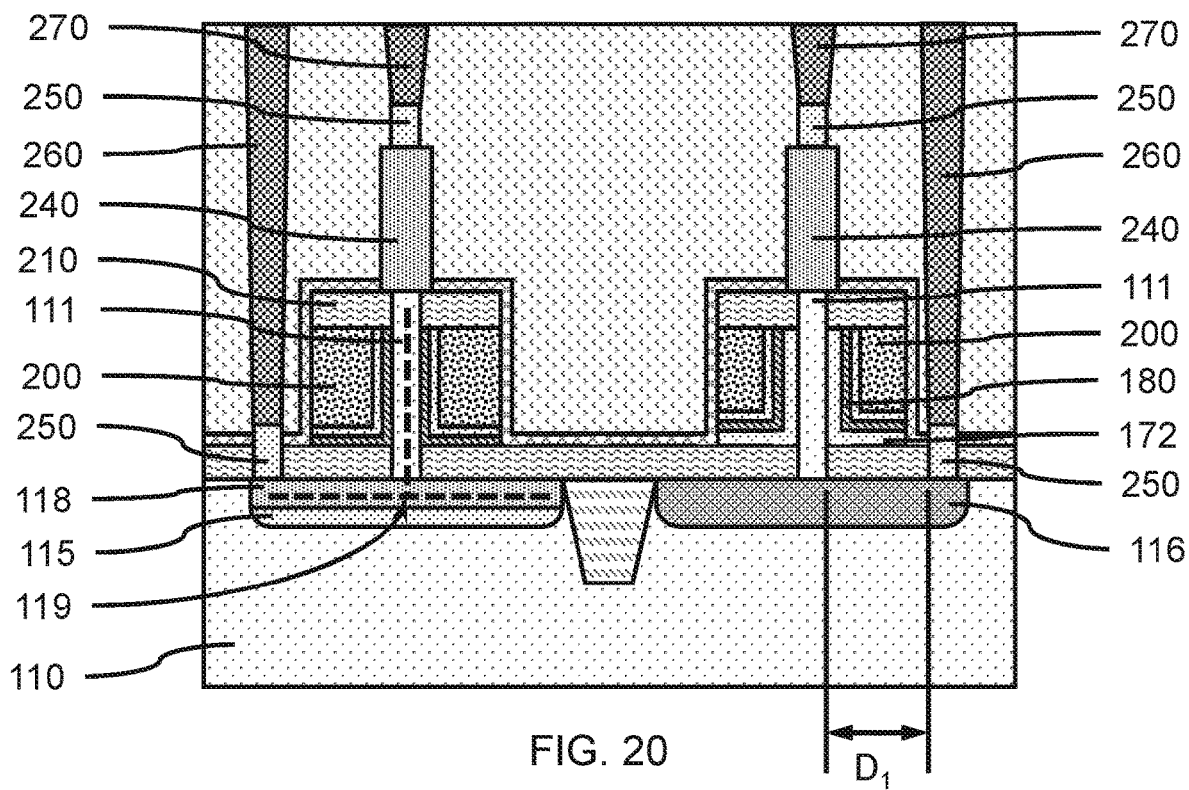
FIG. 20 is a cross-sectional side view showing electrical contacts formed to each of the top source/drains, the bottom source/drain, and the n-type doped well, in accordance with an embodiment of the present invention.

FIG. 20 is a cross-sectional side view showing electrical contacts formed to each of the top source/drains, the bottom source/drain, and the n-type doped well, in accordance with an embodiment of the present invention.

In one or more embodiments, vias or trenches can be formed in the ILD layer 230 down to the bottom source/drain region 118, doped well 116, and the top source/drains 240. Via and trench liner layers can be formed in the vias and trenches to act as diffusion barriers, and can form a metal silicide (e.g., TiSi) on the bottom source/drain region 118, doped well 116, and the top source/drains 240. The via liner layers can be a titanium (Ti) and titanium nitride (TiN) bilayer.

Contact layers 250 can be formed on the bottom source/drain region 118, doped well 116, and the top source/drains 240 to improve electrical connectivity and reduce resistance. The contact layers 250 can be formed by epitaxial growth of silicon (Si) and/or silicon-germanium (SiGe) on the bottom source/drain region 118, doped well 116, and the top source/drains 240, where the contact layers 250 can be highly doped. Doping of the contact layers 250 can be performed using, for example, ion implantation, or annealing, or in situ during an epitaxial process. In a non-limiting illustrative example, the doping of the contact layer 250 uses, for example, arsenic (As) or phosphorous (P) for n-type device (e.g., nFET), and boron (B) for a p-type device (e.g., pFET), at concentrations in the range of about $1 \times 10^{20}$ atoms/cm$^3$ to about $1 \times 10^{21}$ atoms/cm$^3$. In various embodiments, the dopant concentration of the contact layers 250 can be at least 5 times the dopant concentration of the doped wells 115, 116, or similar to the bottom source/drain 118.

In various embodiments, top electrical contacts 270 can be formed on the contact layers 250 on the top source/drains 240, and bottom electrical contacts 260 can be formed on the contact layers 250 on the bottom source/drain region 118 and the doped well 116. The bottom electrical contacts 260 and top electrical contacts 270 can be a conductive material, for example, tungsten (W), tantalum (Ta), tantalum nitride (TaN), cobalt (Co), ruthenium (Ru), or any other conductor that can be conformally deposited. These bottom electrical contacts 260 and top electrical contacts 270 can be deposited in blanket form (covering all exposed surfaces) and then polished, using for example, chemical mechanical polishing (CMP). A gate contact can be formed to each gate.

In various embodiments, the bottom electrical contact 260 and contact layer 250 can be separated by a lateral distance, Di, from the doped well 116 in a range of about 20 nm to about 200 nm, or in a range of about 50 nm to about 100 nm, although other distances are also contemplated, where the lateral distance, Di, can alter the resistance and voltage capacity of the power device.

In various embodiments, the n-type doped well 116 or p-type doped well 115 and bottom source/drain region 118 through a vertical fin to the top source/drain 240 can form an inverted T-shaped conductive region 119 between the bottom electrical contacts 260 and top electrical contacts 270. The inverted-T shape well can achieve an optimal tradeoff between the device's ON-resistance and high voltage capability. The depth of the well 116 can provide another variable for tuning the well resistance without increasing the footprint (i.e., area) of the power transistor. This inverted T-shaped conductive region can allow the power transistor to handle a much higher power. The inverted T-shaped conductive region 119 of a power FinFET structure can include a single vertical fin 111 forming the device channel, whereas a logic device can include multiple fins 111 on the same bottom source/drain 118, in which case the logic devices could lose the benefit of the inverted T-shaped conductive region. Compared to a VMOS FET with a V-shaped gate, the present structure is simpler and can be integrated into the vertical FinFET fabrication process flow. The power FinFET and logic devices can be made at the same time using the same processes and layers.

In a non-limiting exemplary embodiments, current can flow from a top source of the Power FinFET through the vertical fin channel to the lightly doped well 116 without a bottom source/drain region, across to the electrical contact 250, and up the bottom electrical contact 260, which can be at 10 volts. A higher resistance of the lightly doped well 116 can reduce the current through the channel compared to a highly doped source/drain to avoid destroying the power device.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A logic device and a power device on a substrate, comprising:
    a first vertical fin on a first region of the substrate and a second vertical fin on a second region of the substrate, wherein an isolation region separates the first region from the second region;
    a first doped well and a bottom source/drain region in the substrate below the first vertical fin;
    a second doped well in the substrate below the second vertical fin;
    a bottom spacer layer on the bottom source/drain region and the second doped well;
    a dielectric under-layer segment on the bottom spacer layer and the second vertical fin; and
    a gate dielectric layer on the dielectric under-layer segment.

2. The logic device and a power device of claim 1, wherein the dielectric under-layer segment has a thickness in a range of about 5 nm to about 10 nm.

3. The logic device and a power device of claim 1, wherein the dielectric under-layer segment is made of a material selected from the group consisting of silicon oxide (SiO), silicon oxynitride (SiON), silicon boro carbonitride (SiBCN), silicon oxycarbonitride (SiOCN), and combinations thereof.

4. The logic device and a power device of claim 1, wherein the gate dielectric layer is also on the first vertical fin.

5. The logic device and a power device of claim 1, further comprising a first work function layer on the gate dielectric layer and dielectric under-layer segment, and a first conductive gate fill on the work function layer.

6. The logic device and a power device of claim 5, further comprising a second work function layer on the first vertical fin, and a second conductive gate fill on the second work function layer.

7. The logic device and a power device of claim 6, further comprising a first top spacer on the first conductive gate fill, and a second top spacer on the second conductive gate fill.

8. The logic device and a power device of claim 7, further comprising a first top source/drain on the first vertical fin and a second top source/drain on the second vertical fin.

9. The logic device and a power device of claim 8, further comprising a barrier layer on the first top spacer, the first conductive gate fill, the second top spacer and the second conductive gate fill.

10. A logic device and a power device on a substrate, comprising:
    a first vertical fin on a first region of the substrate and a second vertical fin on a second region of the substrate, wherein an isolation region separates the first region from the second region;
    a first doped well and a first bottom source/drain region in the substrate below the first vertical fin;
    a second doped well in the substrate below the second vertical fin, wherein a second bottom source/drain region is not in the second doped well under the second vertical fin;
    a bottom spacer layer on the first bottom source/drain region and the second doped well;
    a dielectric under-layer segment on the bottom spacer layer and the second vertical fin; and
    a gate dielectric layer on the first vertical fin, the bottom spacer layer, and the dielectric under-layer segment.

11. The logic device and a power device of claim 10, wherein the dielectric under-layer segment is made of a material selected from the group consisting of silicon oxide (SiO), silicon oxynitride (SiON), silicon boro carbonitride (SiBCN), silicon oxycarbonitride (SiOCN), and combinations thereof.

12. The logic device and a power device of claim 11, wherein the gate dielectric layer is made of a material selected from the group consisting of silicon oxide (SiO), silicon nitride (SiN), silicon oxynitride (SiON), boron nitride (BN), high-k dielectric materials, and combinations thereof.

13. The logic device and a power device of claim 12, wherein the gate dielectric layer has a thickness in the range of about 7 Å to about 30 Å, and the dielectric under-layer segment has a thickness in the range of about 5 nm to about 10 nm.

14. The logic device and a power device of claim 13, further comprising a first work function layer on the first vertical fin, wherein the gate dielectric layer is between the first work function layer and bottom spacer layer.

15. The logic device and a power device of claim 14, further comprising a second work function layer on the second vertical fin, wherein the gate dielectric layer is between the dielectric under-layer segment and the second work function layer.

16. A logic device and a power device on a substrate, comprising:
   a first vertical fin on a first region of the substrate and a second vertical fin on a second region of the substrate, wherein an isolation region separates the first region from the second region;
   a first doped well and a bottom source/drain region in the substrate below the first vertical fin;
   a second doped well in the substrate below the second vertical fin, wherein a second bottom source/drain region is not in the second doped well under the second vertical fin;
   a bottom spacer layer on the bottom source/drain region and the second doped well;
   a dielectric under-layer segment on the bottom spacer layer and the second vertical fin;
   a first contact layer on and in electrical contact with the first bottom source/drain;
   a second contact layer on and in electrical contact with the second doped well;
   a first gate dielectric layer on the bottom spacer layer and the first vertical fin;
   a second gate dielectric layer on the dielectric under-layer segment and second vertical fin.

17. The logic device and a power device of claim 16, further comprising a first bottom electrical contact on and in electrical contact with the first contact layer, and a second bottom electrical contact on and in electrical contact with the second contact layer.

18. The logic device and a power device of claim 17, wherein the first doped well can be a p-type doped well and the second doped well can be an n-type doped well, wherein the n-type doped well has a dopant concentration in the range of about $1\times10^{17}$ atoms/cm$^3$ to about $1\times10^{19}$ atoms/cm$^3$, and the bottom source/drain region has a dopant concentration in the range of about $1\times10^{18}$ atoms/cm$^3$ to about $1\times10^{21}$ atoms/cm$^3$.

19. The logic device and a power device of claim 18, wherein a lateral distance between the second contact layer and second vertical fin is in a range of about 20 nm to about 200 nm.

20. The logic device and a power device of claim 19, wherein the bottom source/drain region has a dopant concentration of at least 5 times the dopant concentration of the doped well, and the n-type doped well has a depth in a range of about 30 nm to about 150 nm.

* * * * *